United States Patent
Chuang et al.

(10) Patent No.: US 12,074,032 B2
(45) Date of Patent: *Aug. 27, 2024

(54) HEAT SHIELD FOR CHAMBER DOOR AND DEVICES MANUFACTURED USING SAME

(71) Applicant: Taiwan Semiconductor Manufacturing Co., Ltd., Hsinchu (TW)

(72) Inventors: Meng-Je Chuang, Hsinchu (TW); Wan-Chun Kuan, Chiayi (TW); Yi-Wei Chiu, Kaohsiung (TW); Tzu-Chan Weng, Kaohsiung (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 387 days.

This patent is subject to a terminal disclaimer.

(21) Appl. No.: 17/340,766

(22) Filed: Jun. 7, 2021

(65) Prior Publication Data
US 2021/0296135 A1    Sep. 23, 2021

Related U.S. Application Data

(63) Continuation of application No. 15/406,143, filed on Jan. 13, 2017, now Pat. No. 11,031,252.
(Continued)

(51) Int. Cl.
*H01L 21/311* (2006.01)
*H01J 37/32* (2006.01)
(Continued)

(52) U.S. Cl.
CPC ............. *H01L 21/31116* (2013.01); *H01J 37/32009* (2013.01); *H01J 37/3244* (2013.01); *H01L 21/3065* (2013.01); *H01L 21/67069* (2013.01); *H01L 21/67103* (2013.01); *H01L 21/67126* (2013.01); *H01L 21/6719* (2013.01); *H01L 21/67201* (2013.01); *H01J 2237/334* (2013.01);
(Continued)

(58) Field of Classification Search
CPC ........................... H01J 37/18; H01J 37/32513
See application file for complete search history.

(56) References Cited

U.S. PATENT DOCUMENTS

| | | |
|---|---|---|
| 5,362,353 A | 11/1994 | Mallon |
| 5,531,185 A | 7/1996 | Asano et al. |

(Continued)

FOREIGN PATENT DOCUMENTS

| | | |
|---|---|---|
| CN | 103296069 A | 9/2013 |
| CN | 104106130 A | 10/2014 |

(Continued)

*Primary Examiner* — Karla A Moore
*Assistant Examiner* — Nathan K Ford
(74) *Attorney, Agent, or Firm* — Slater Matsil, LLP

(57) ABSTRACT

A chamber door, such as an etch chamber door may be heated during etch processing to, e.g., prevent etching by-products from adhering to the etch chamber door. Such heating of the etch chamber door, however, can impact the processing parameters and result in non-uniform processing, such as non-uniform etching characteristics across a semiconductor wafer, for instance. An insulator, such as an insulating film covering surfaces of the heated door, can reduce or eliminate transmission of heat from the door to a work piece such as a semiconductor wafer and this reduce or eliminate the non-uniformity of the process results.

20 Claims, 8 Drawing Sheets

Related U.S. Application Data

(60) Provisional application No. 62/428,466, filed on Nov. 30, 2016.

(51) Int. Cl.
*H01L 21/3065* (2006.01)
*H01L 21/67* (2006.01)
*H01L 21/8234* (2006.01)
*H01L 29/66* (2006.01)

(52) U.S. Cl.
CPC ............ *H01L 21/823431* (2013.01); *H01L 29/66742* (2013.01); *H01L 29/66795* (2013.01)

(56) References Cited

U.S. PATENT DOCUMENTS

| | | |
|---|---|---|
| 6,187,072 B1 | 2/2001 | Cheung et al. |
| 7,015,106 B2 | 3/2006 | Yoon et al. |
| 7,622,392 B2 | 11/2009 | Nishimura et al. |
| 8,419,893 B2 | 4/2013 | Willwerth et al. |
| 8,748,989 B2 | 6/2014 | Lin et al. |
| 9,461,195 B2 | 10/2016 | Moschner et al. |
| 10,734,246 B2 | 8/2020 | Chuang et al. |
| 2001/0015074 A1 | 8/2001 | Hosokawa |
| 2004/0175944 A1 | 9/2004 | Kobayashi |
| 2004/0182315 A1 | 9/2004 | Laflamme, Jr. et al. |
| 2006/0105107 A1 | 5/2006 | Lindeboom et al. |
| 2008/0302989 A1 | 12/2008 | Seitz |
| 2010/0282710 A1 | 11/2010 | Kitamura et al. |
| 2011/0290340 A1 | 12/2011 | Ishigaki et al. |
| 2015/0152555 A1 | 6/2015 | Mai et al. |
| 2017/0211706 A1 | 7/2017 | Amir et al. |

FOREIGN PATENT DOCUMENTS

| | | |
|---|---|---|
| CN | 104303316 A | 1/2015 |
| CN | 104934348 A | 9/2015 |
| JP | 2010177357 A | 8/2010 |
| KR | 1020050027781 A | 3/2005 |
| KR | 20160022718 A | 3/2016 |
| TW | 200949113 A | 12/2009 |

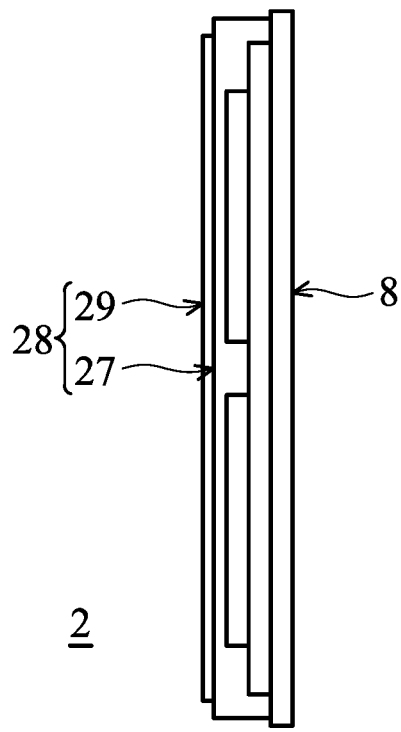
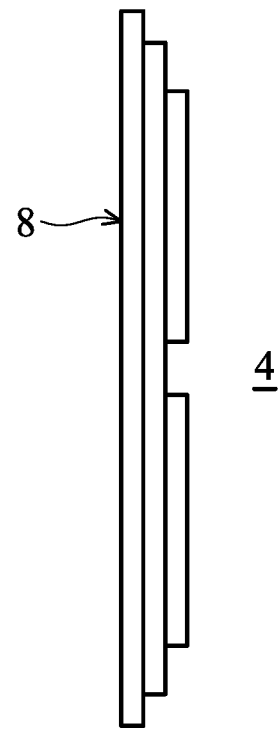
Figure 4c
Figure 4d
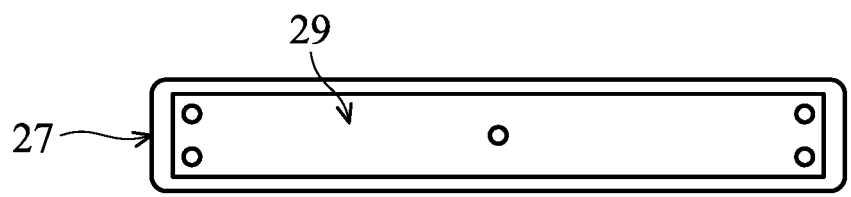
Figure 4e

HEAT SHIELD FOR CHAMBER DOOR AND DEVICES MANUFACTURED USING SAME

PRIORITY CLAIM

This application is a continuation of U.S. patent application Ser. No. 15/406,143 filed on Jan. 13, 2017, entitled "Heat Shield for Chamber Door and Devices Manufactured Using Same," which claims priority to U.S. Provisional Patent Application No. 62/428,466 filed Nov. 30, 2016, and entitled "Heat Shield for Chamber Door and Devices Manufactured Using Same," which applications are incorporated herein by reference.

BACKGROUND

As semiconductor devices are manufactured using smaller and smaller device geometries subject to more and more rigorous critical dimension control and uniformity requirements, improved processes and manufacturing equipment are required to produce advanced devices with acceptable levels of performance and yield.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4a-4e provide further details of an exemplary chamber door according to some embodiments.

DETAILED DESCRIPTION

Figure 1:
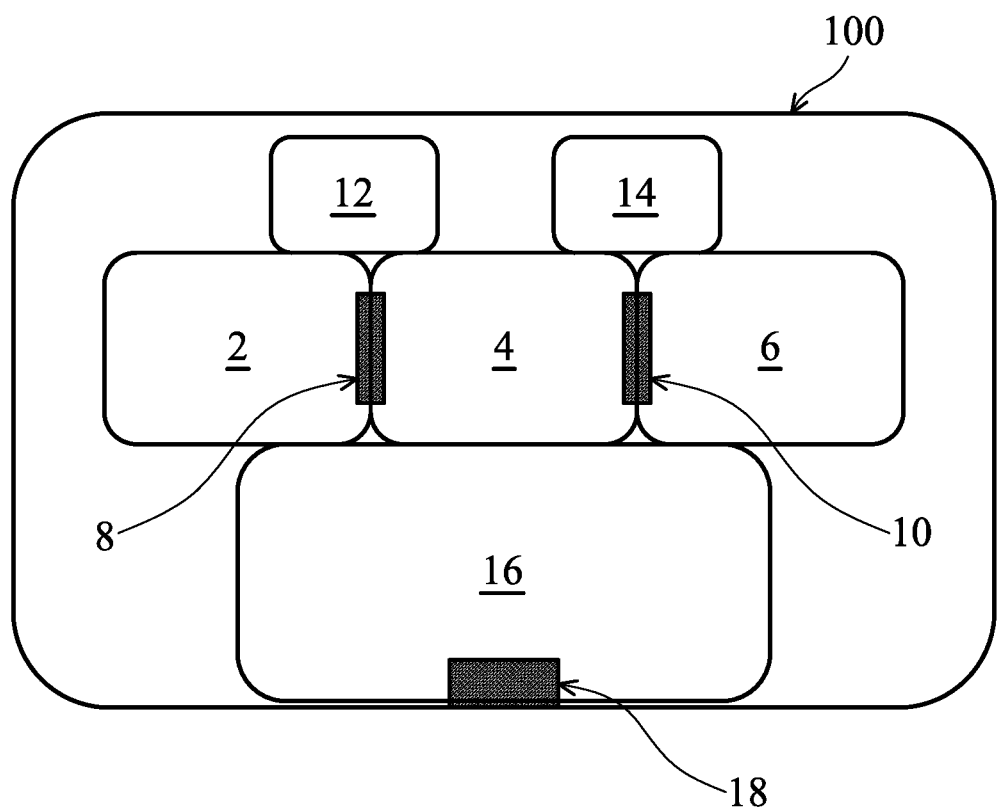
FIG. 1 illustrates an exemplary multi-chamber processing device in accordance with some embodiments.

The following disclosure provides many different embodiments, or examples, for implementing different features of the provided subject matter. Specific examples of components, values, operations, materials, arrangements, and the like, are described below to simplify the present disclosure. These are, of course, merely examples and are not intended to be limiting. Other components, values, operations, materials, arrangements, and the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Before addressing specific illustrated embodiments in detail, the embodiments disclosed herein are addressed generally. In general terms, embodiments disclosed herein relate to a manufacturing chamber in which work pieces are introduced through a chamber door. More specifically, the chamber door may by heated before, during, or after specific processes, in order to assist in the process, to reduce or eliminate adverse or undesirable consequences of the process, or for other reasons. In some instances, the heating of the chamber door may be desirable, but may also cause unintended or undesirable side effects. As but one example, heat generated to heat the door might radiate out (or be transmitted through other means such as conduction, convention, and the like) and might heat all or a portion of the work piece upon which the process is being performed or might heat the region immediately surrounding the work piece (e.g., the air or other environment at or near the work piece or the equipment or structures near or touching the work piece). Such heating of the work piece or areas near the work piece could change or otherwise impact the process parameters and the process results. For example, heat transmitted from the door could cause a thermal gradient across the work piece itself, meaning that the (temperature) parameters at which the process is occurring would be different at one end or region of the work piece (e.g., closest to the chamber door) relative to another end or region of the work piece (e.g., furthest from the chamber door).

In a somewhat more specific example, a semiconductor wafer may be placed in a process chamber such as an etch chamber through a chamber door and then subjected to an etch process. In order to prevent by-products of the etch process from adhering to the chamber door (and possibly subsequently falling onto the wafer or another wafer and causing defects), the chamber door may be heated during the etching process. Such heat from the chamber door could radiate (or otherwise be transmitted) to the wafer and cause the wafer to have a temperature differential across it, which temperature differential could cause the etch process to proceed more rapidly in one region of the wafer relative to another region of the wafer. This will result in non-uniform results of the etch process, meaning some regions of the wafer could be over-etched, other regions of the wafer could be under-etched, or both. Generally speaking, it is desirable to maintain maximum uniformity of processes when manufacturing semiconductor devices, however. By providing a thermal shield between the chamber door and the wafer, however, the adverse consequences of heating the door can be reduced or eliminated entirely, as the followed detailed disclosure further explains.

FIG. 1 illustrates an exemplary manufacturing device 100, which is a multi-chamber processing device in the illustrated embodiment. One skilled in the art will recognize that the principles of the present disclosure apply equally to a single chamber processing device, however. Device 100 includes a first chamber 2, a second chamber 4, and a third chamber 6. As an example, first chamber 2 is an etch chamber having appropriate structures, such a gas inlet and outlet valves, heating elements, one or more stages for holding work pieces, pumps, sensors, and the like (not shown) configured to etch one or more layers or regions of a work piece placed within first chamber 2. The work piece (not shown) could be, e.g. a semiconductor wafer upon which one or more integrated circuits are manufactured or to be manufactured. For clarity of discussion, the term work piece and semiconductor wafer will be used interchangeably in the ensuing discussion, although this disclosure is not limited to only a semiconductor wafer as being the work piece. Continuing with the present example, second chamber 4 is a heat treatment chamber in which a heat treatment such as a pre-heat soak, a thermal anneal, a post-process heat ramp down, or the like can be performed on the semiconductor wafer. Chamber 4 is outfitted with appropriate structures such as wafer holding stages, heaters, heat sensors, and the like that are within the scope of the contemplated embodiments but are not necessary for an understanding of concepts disclosed herein and hence are not shown. Chamber 6 is another chamber, which could in some embodiments be another etch chamber similar to chamber 2, or could be a chamber in which a different type of process is performed on a workpiece.

In the illustrated embodiment, first chamber 2 and second chamber 4 have a chamber door 8 (sometimes referred to herein as a gate door or simply a door) allowing a wafer to be transported from first chamber 2 to second chamber 4 and/or from second chamber 4 to first chamber 2. Advantageous features of exemplary chamber door 8 are that the door is robust and able to withstand the conditions of the etch chamber and/or the heat treatment chamber, that the door can effectively seal first chamber 2 and/or second chamber 4 (e.g., to prevent process gasses from escaping a chamber, to allow for a vacuum to be created and maintained within a chamber, to protect the chamber from environmental contaminants, and the like). Similarly, second chamber 4 and third chamber 6 have a chamber door 10 allowing a wafer to be transported from second chamber 4 to third chamber 6 and/or from third chamber 6 to second chamber 4. Chamber door 10 is also referred to sometimes herein as a gate door or simply a door and may be of similar design and construction as door 8, although this is not always the case.

FIG. 1 also illustrates a first heater 12 and a second heater 14 associated with door 8 and door 10, respectively. In the illustrated embodiment two heaters are disclosed. In other embodiments, only a single heater could be associated with both door 8 and door 10. In yet other embodiments, a single heater is associated with only door 8 (or with only door 10) and the other door 10 (or other door 8) is not heated. In the illustrated embodiment, heater 12 is configured to heat door 8 and heater 14 is configured to heat door 10, as will be discussed in further detail below. One skilled in the art will recognize that heater 12 and/or heater 14 might also be employed to heat other regions within respective chambers 2 and 4, and also within chamber 6, such as wafer chucks, or the like, if needed.

Load lock module (LLM) 16, is another chamber of device 100 in which work pieces such as semiconductor wafers can be loaded into device 100 for processing and unloaded from device 100 after processing is complete. In addition to other functions, LLM 16 functions as a vacuum/atmosphere switch chamber, allowing workpieces to be loaded into and removed from processing device 100 without breaking the vacuum conditions within the various processing chambers 2, 4, 6, etc. Wafers are loaded into load lock chamber through a door 18. From load lock chamber 16, wafers can be transferred to first chamber 2, second chamber 4, and/or third chamber 6. The door or other mechanism by which a wafer is loaded from LLM 16 to chamber 2 or chamber 4 or chamber 6 is not illustrated for sake of clarity. It should be noted, however, that the teaching provided herein with regard to chamber door 8 and/or chamber door 10 could equally be applied to a similar door between LLM 16 and one or more of chambers 2, 4, and 6. In other embodiments, LLM 16 could be centrally located within device 100 with first, second and third chambers (and perhaps additional chambers) surrounding LLM 16. In yet other embodiments, LLM 16 may communicate with only one of first chamber 2, second chamber 4 or third chamber 6 and wafers pass sequentially through the various chambers in such an embodiment. In such an embodiment, in which wafer pass sequentially through chambers, a second LLM (not shown) could be provided at the far end of processing device 100, with one LLM providing for ingress of incoming work pieces into processing device 100 and a second LLM providing for egress of outgoing work pieces out of processing device 100. Other configurations and arrangements of the chambers are within the contemplated scope of the present disclosure.

Figure 2:
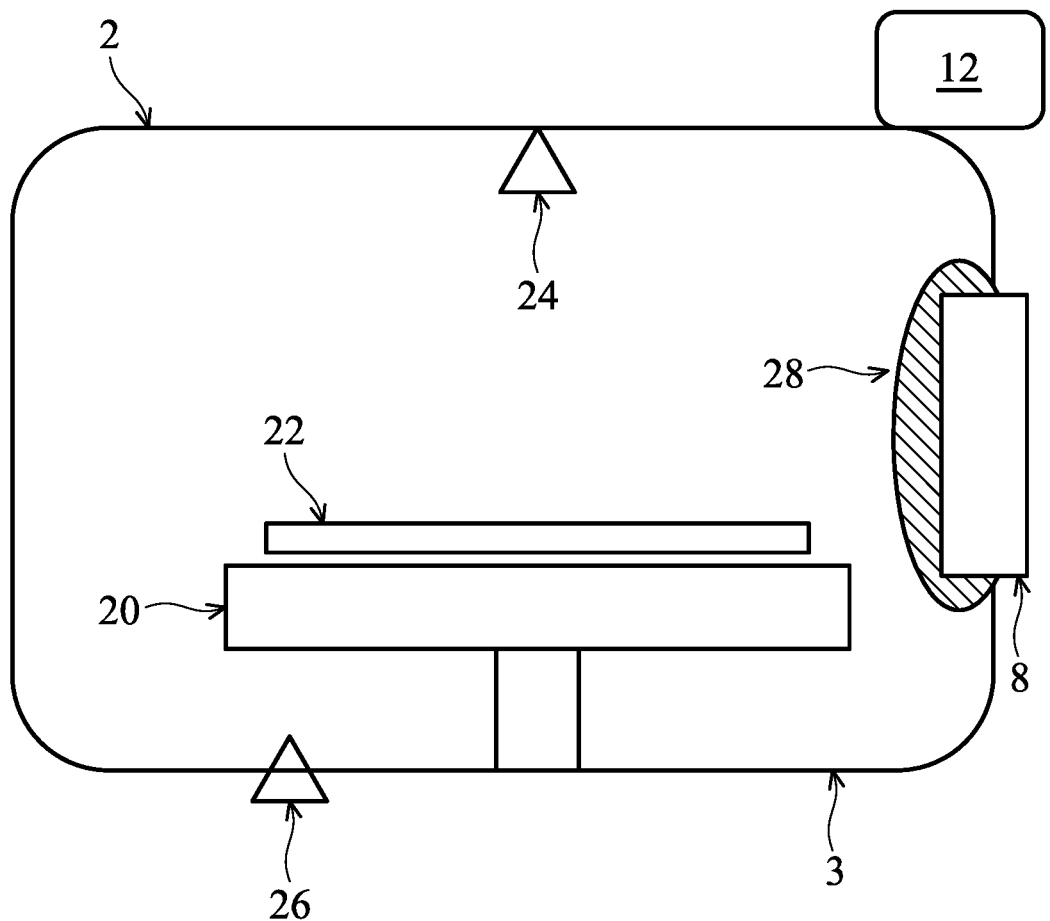
FIG. 2 illustrates in more detail an exemplary chamber for a processing device in accordance with some embodiments.

FIG. 2 illustrates exemplary first chamber 2 in more detail. First chamber 2 is defined, at least in part, by chamber wall 3. In the illustrated embodiment, door 8 passes through chamber wall 3. A stage, such as wafer holding stage 20 located within chamber 2 is configured to hold or otherwise support a work piece such as wafer 22. Chamber 2 may also include one or more process gas inlets 24 and one or more process gas outlets 26. For instance, an etchant gas such as HF may be introduced through gas inlet(s) 24 into chamber 2 in order to etch, e.g., a silicon oxide layer on wafer 22. Excess process gas and etchant by-products are removed from chamber 2 by way of exhaust outlet(s) 26. As discussed above, it is desirable to heat door 8 in order to reduce or eliminate adhesion of etchant by-products to door 8. If such by-products do adhere to door 8, they will not be evacuated (or otherwise removed) from the chamber by gas outlet(s) 26. Such etchant by-products can include $NH_4F$, $(NH_4)_2SiF_6$, and the like, although the present disclosure applies equally to other by-products of other processes as well. By-products adhered to the door can subsequently drop off or flake off from the door and potentially land on wafer 22, causing particle defects on the resulting integrated circuit(s) being manufactured on wafer 22. In a contemplated embodiment, heater 12 heats door 8 to a temperature of from about 80° C. to about 120° C.

Because of the proximity of door 8 to wafer 22, heat from door 8 will radiate or otherwise transmit to all or a portion of wafer 22, particularly the portions closest to door 8. As addressed above, a non-uniformity of the temperature across wafer 22 will result in a non-uniformity of the etch process across wafer 22, leading to undesirable consequence. Heat shield 28 eliminates or at least substantially reduces heat transmission from door 8 to wafer 22. In the embodiment illustrated in FIG. 2, heat shield 28 covers portions of door 8 that are exposed to the inside of chamber 2 and thermally insulates door 8. In the illustrated embodiment, door 8 is formed of aluminum. Heat shield 28 may be formed of Teflon as an example. Teflon has been found to be a good material for heat shield for several reasons. First, Teflon provides good thermal insulation properties to reduce or eliminate inadvertent heating of wafer 22. Additionally, Teflon does not react with and is substantially impervious to HF and other common etchants. In this way, heat shield 28 is not damaged by or consumed during etch processes. Additionally, Teflon has properties that are compatible with aluminum (does not adversely react therewith) and Teflon is not incompatible with most materials and processed used in semiconductor manufacturing. Another advantage of Teflon is that it can be manufactured as a flexible membrane and hence can be applied over exposed surfaces of door 8 as such. For instance, heat shield 28 can be a membrane of from about 10 mm to about 30 mm in thickness covering exposed surfaces of door 8. Heat shield 28 can be mounted to door 8 using screws or other appropriate fasteners. In other contemplated embodiments, heat shield 28 can be applied to door 8 as a form-fitting coating (e.g., applied in a liquid state and allowed to cure).

Other materials that are suitable candidates for heat shield 28 include glass fiber, quartz, Bakelite, ceramic, and the like. One skilled in the art will recognize that other materials could be used, provided the candidate material achieves the desired properties of thermal insulation, resistance to common etch gases and conditions, compatibility with the materials and structure of door 8 (or door 10 or other door as the case may be), and compatibility with common semiconductor processes and materials (or the processes and materials common to the particular workpiece being processed within processing device 100).

Figure 3:
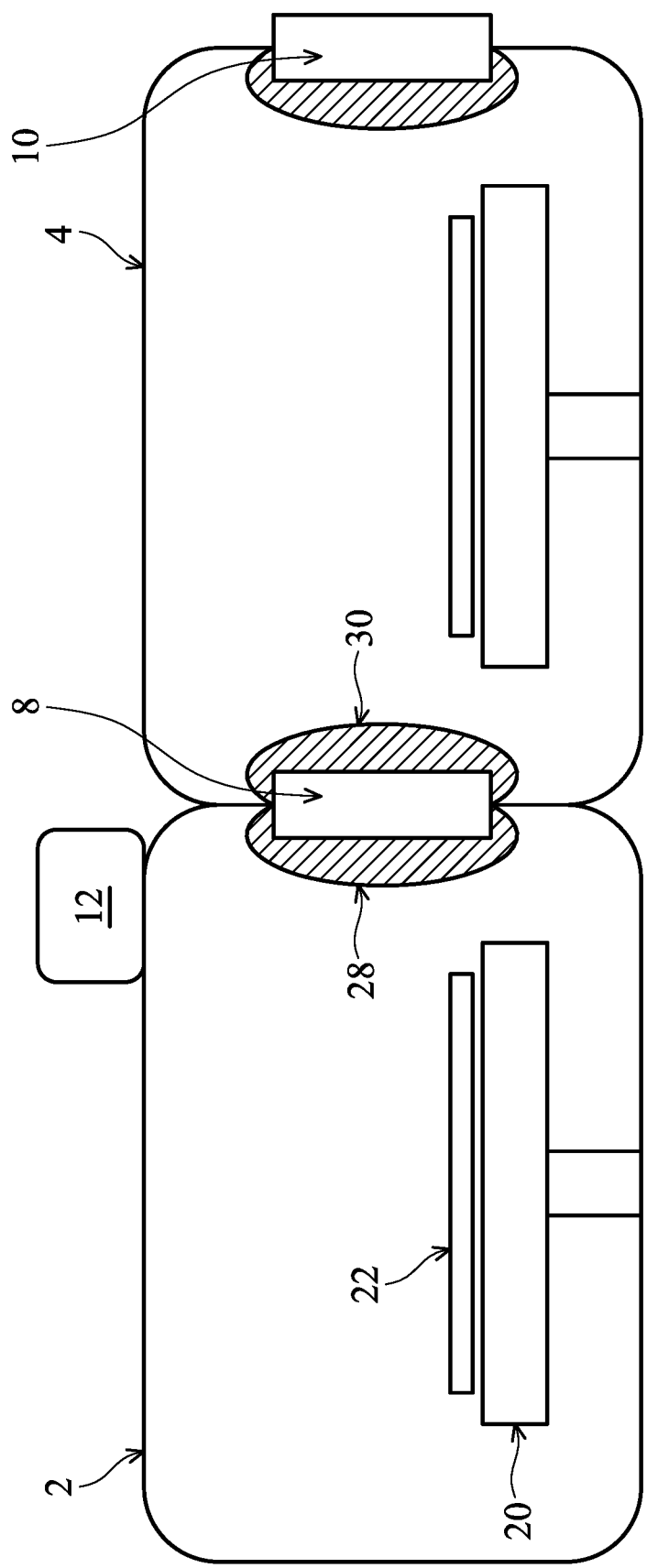
FIG. 3 illustrates an exemplary chamber door having a heat shield on both faces according to some embodiments.

In the embodiment of FIG. 2, it is necessary only to provide heat shield 28 on one side of door 8, e.g., because the risk of by-product or other particle adhesion in chamber 4 (to which the other side of door 8 faces) is not a concern. This is not always the case, however. FIG. 3 illustrates an embodiment in which both sides (also referred to herein as both faces) of door 8 are prone to the adhesion concern. In this case, heat shield 28 insulates a face of door 8 within or facing chamber 2 and heat shield 30 insulates a face of door 8 within or facing chamber 4. Likewise, in FIG. 3, heat shield 32 insulates door 10, or at least the side of door 10 within or facing chamber 4.

Figure 4A:
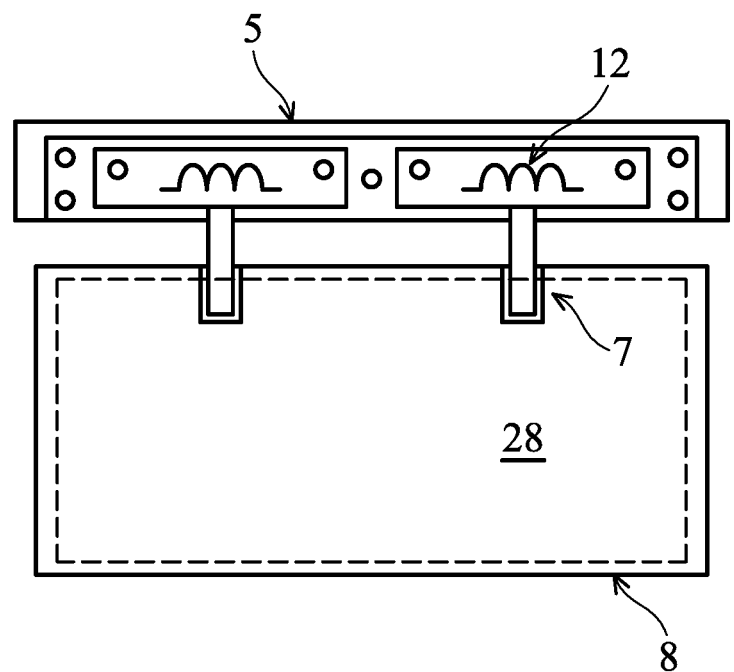
Figure 4B:
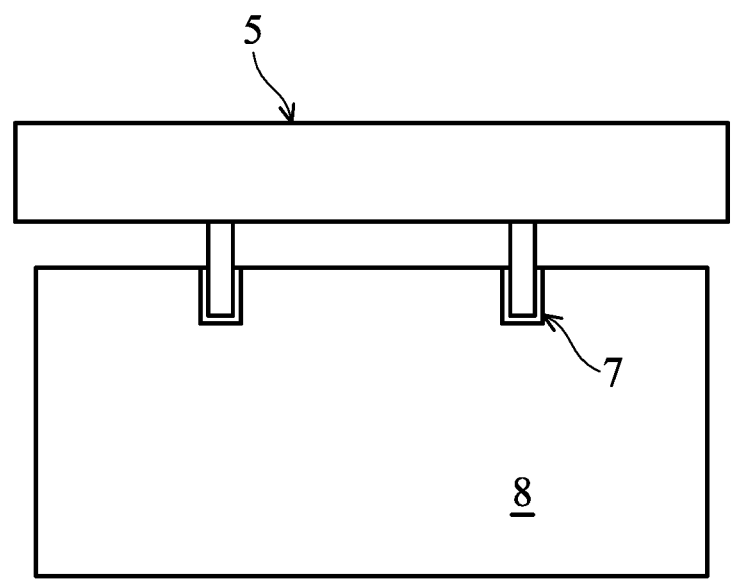

FIGS. 4a-4e provide further details of illustrative door 8 and heat shield 28. This teaching applies equally to illustrative door 10, or any other door within processing device 100 (whether illustrated in FIG. 1 or not) in which a thermally insulating cover is needed. FIG. 4a schematically illustrates in plan view door 8 when viewed from processing chamber 2 and FIG. 4b schematically illustrates in plan view door 8 when viewed from processing chamber 4. Heat shield 28 is illustrated in FIG. 4a with dotted lines, so as not to obscure details of features underlying heat shield 28. In the illustrated embodiment heat shield 28 extends over the major face of door 8 that is exposed to chamber 2. In the illustrated embodiment, heat shield 28 does not extend to the outer perimeter of the inner face of door 8. In some embodiments, a portion of door 8 might need to make contact with an inner surface of chamber wall 3 (see FIG. 1) in order to fully seal chamber 2 (or chamber 4, 6, 16, etc., depending upon the configuration). In such embodiments, it may be necessary that heat shield 28 not extend to the outer periphery of door 8 in order to ensure heat shield 28 does not interfere with the closing of door 8 and/or the sealing of chamber 2 (or other chamber). In other embodiments, heat shield 28 can extend to the out periphery of door 8. FIG. 4b illustrates a second face of door 8, in this case the face that faces the interior of chamber 4. Although not a limiting feature of the embodiments disclosed herein, door 8 is illustrated as having an attachment region 5 which may be attached through screws, adhesives, magnetic forces, or other fastening device to chamber wall 3 (illustrated in FIG. 1) and hinges 7 which allow door 8 to rotate about attachment region 5 and hence allow ingress and egress of workpieces to chamber 2. Also shown in the embodiment of FIG. 4a, heater 12 may be placed at least partially within attachment region 5 in order to allow for thermal conduction of heat from heater 12 to door 8. One skilled in the art will recognize numerous other arrangements that can provide for the advantageous benefits of the illustrated embodiments and stay within the contemplated scope of this disclosure. In this embodiment, as shown in FIG. 4b, no heat shield is applied to the side of door 8 which faces into chamber 4. In this embodiment, the possibility about process by-products or other contaminants forming on door 8 and contaminating a workpiece is not a concern, and hence no heat is required. For instance, if no etch processing occurs in chamber 4, the chances of the formation of process by-products or other contaminants are minimal or non-existent.

FIG. 4c illustrates more details of door 8 and heat shield 28 from a top down view. As shown, heat shield 28 includes a Teflon membrane 27 and a plate 29, which in this embodiment is an aluminum plate. By contrast, FIG. 4d shows that the "other side" of door 8, the side facing chamber 4 does not require a heat shield 28. FIG. 4e illustrates heat shield 28 including Teflon membrane 27 and plate 29 from a side view. As shown, plate 29 may attach to Teflon membrane 27 and to the face of door 8 using one or more fasteners such as screws illustrated in FIG. 4e. In other embodiments, heat shield 28 may be attached to door 8 using an adhesive, a clamp, or the like. In an embodiment, plate 29 is made of aluminum, which is the same material as door 8 and the chamber walls. Other embodiments could include materials with an emissivity similar to that of polished aluminum, ($\varepsilon=0.02\sim0.1$), such as for example, polished zinc ($\varepsilon=0.045$), polished tungsten ($\varepsilon=0.04$), tin ($\varepsilon=0.04$), polished steel ($\varepsilon=0.07$); polished stainless steel polished ($\varepsilon=0.075$), polished silver ($\varepsilon=0.03$), polished nickel ($\varepsilon=0.072$), and the like. The thickness of the plate may range from about 0.2 mm to about 10.0 mm.

Figure 5A:
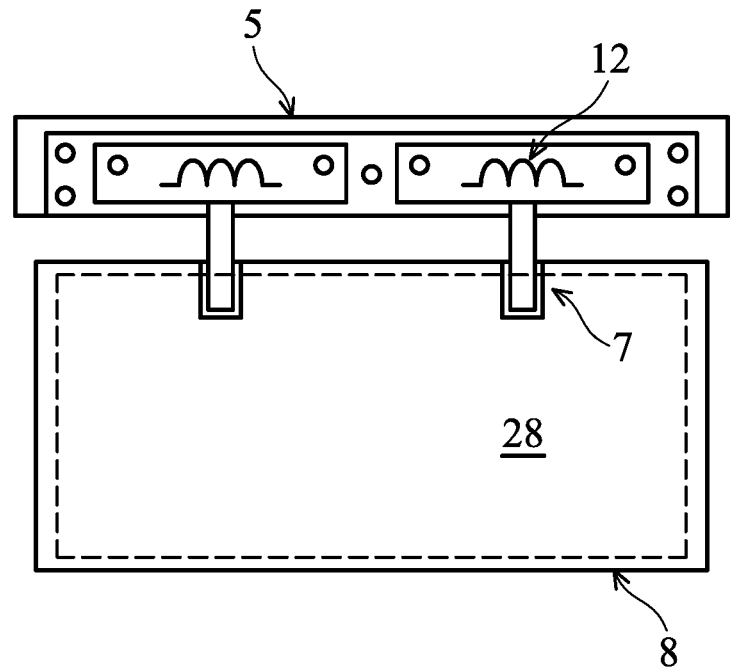
FIGS. 5a-5c provide further details on an alternative exemplary door chamber according to some embodiments.
Figure 5B:
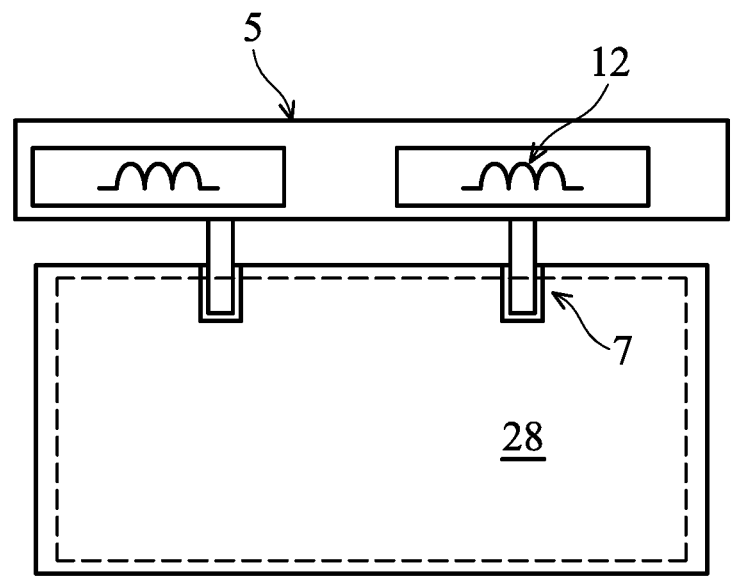
Figure 5C:
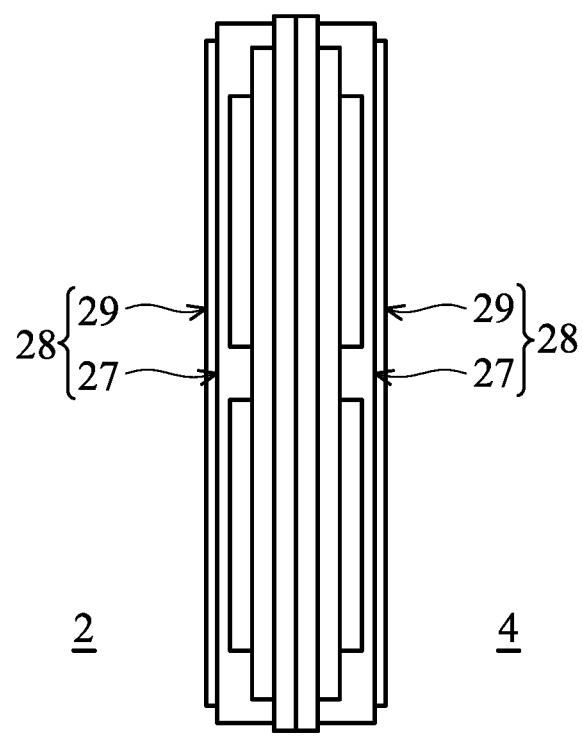

FIGS. 5a through 5c illustrate an alternate embodiment, one in which both chamber 2 and chamber 4 are processing chambers in which it is desirable to heat door 8, while at the same time insulating workpieces within the respective chambers from thermal radiation emanating (through conduction, convection, or other mechanism) towards the workpiece. For instance, both chamber 2 and chamber 4 could be an etch processing chamber, a deposition processing chamber, or the like. In such a case, a heat shield 28 can be applied on both faces of door 8, including the surface facing into chamber 2 and the surface facing into chamber 4, as shown in FIGS. 5a through 5c.

One skilled in the art will recognize that the devices illustrated in FIGS. 1-5 are merely exemplary embodiments of the present disclosure. Different types of chambers can be employed in which different processes are performed (e.g., dry or wet etching, deposition, plasma process, and the like. Additionally, any number of chambers and configurations could be used. Whereas the chambers are illustrated containing only a single wafer, multi-wafer chambers could likewise be employed and still be within the contemplated scope of this disclosure. Similarly, some chambers might have only a single door or door/insulator combination, other chambers might have two doors or door/insulator combinations, and yet other chambers could have more than two doors or door/insulator combinations.

Figure 6:
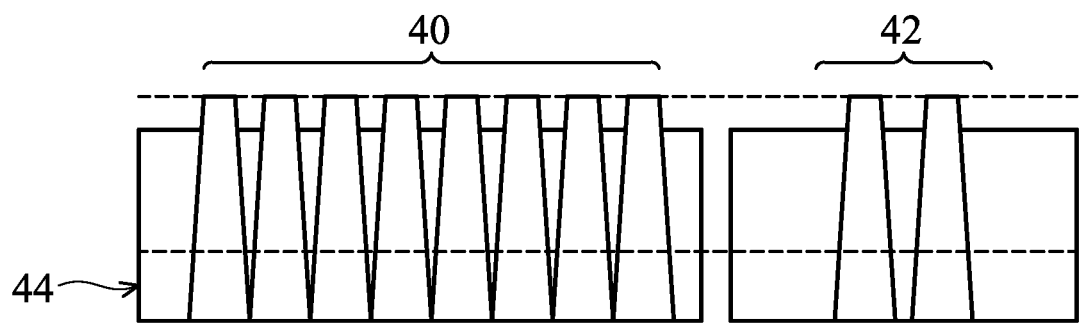
FIGS. 6 and 7 illustrate a pre-etch condition and a post-etch condition, respectively, of an insulating material surrounding a first plurality of semiconductor structures and a second plurality of semiconductor structures, which structures further illustrate advantageous effects of processing using the processing device of the embodiments illustrated herein.
Figure 7:
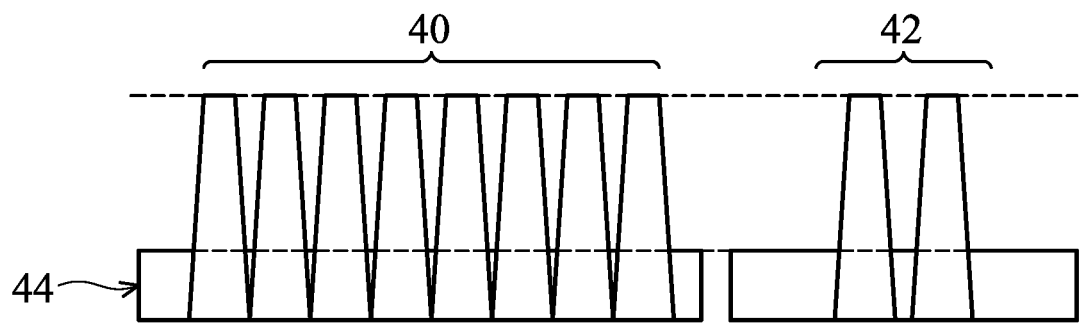

While the above-described device is useful for a wide variety of applications and processes, a particular illustrative application is provided herein. FIGS. 6 and 7 illustrate a portion of an exemplary wafer 22 having a first plurality of semiconductor structures 40 and a second plurality of semiconductor structures 42. For illustrative purposes, semiconductor structures 40 and 42 are illustrated and described herein as fin structures, although other semiconductor structures are within the contemplated scope of the present disclosure. The fins are fin-shaped structures protruding from a major surface of wafer 22, and may be formed of the same material as wafer 22 or a different material such as a material epitaxially grown on the surface of wafer 22. Respective fins are surrounded by or partially surrounded by and insulated from other fins by a dielectric layer 44. As shown in FIG. 6, insulating layer 44 extends a first height up sidewalls of respective fins 40 and 42.

The first plurality of fins 40 have a first spatial density in at least one direction. In the illustrated embodiments, the fins are closely spaced together in the direction from left to right of the illustration. By contrast, second plurality of fins 42 are not closely spaced together, or have a lesser spatial density than does first plurality of fins 40. FIG. 6 also illustrates insulating layer 44 extending a first distance up (sometimes referred to herein as a first height) along the respective sidewalls of fins 40 and 42. Stated another way, a topmost surface of respective fins 40 and respective fins 42 extend a first distance above the topmost surface of insulating layer 44. For purposes of manufacturing integrated circuit devices such as finFETs (or other multi-gate transistors) it may be desirable to (a) increase the height by which the fins 40 and 42 extend above insulating layer 44, while also (b) maintaining close uniformity amongst all the fins (including fins 40 and fins 42) of the height by which the respective fins extend above insulating layer 44. To accomplish this, it is necessary to etch back insulating layer 44—and in particular to etch back insulating layer 44 in a manner in which the etch process and process results are uniform across wafer 22. As may be appreciated by those skilled in the, the oxide removal or etch process commonly employed to etch back the material of insulating layer 44 is sensitive to temperature. The present inventors have recognized that an oxide removal process using HF/$NH_3$ etch chemistries is particularly sensitive to temperature variations. This temperature sensitivity is exacerbated when etching in regions of both high structure density (such as the high density of fins 40) and low structure density (such as the low density of fins 42). The present inventors have recognized the counter-intuitive fact that the etch process is more temperature sensitive in low density structure density regions, and the etch process occurs slower at higher temperatures. Conversely, the etch process occurs more rapidly at lower temperatures. By recognizing these counter-intuitive characteristics of the etch process, the present inventors were able to discern the need for heat shield 28, which justifies the added cost and complexity that would otherwise mitigate against such a structure being placed in the processing chamber.

In the illustrated embodiment, wafer 22 containing fins 40 and 42 and insulating layer 44 is placed into a process chamber, such as chamber 2 (FIG. 2 or 3) through door 8. An etchant gas, such as HF is introduced into chamber 2, e.g. through gas inlet(s) 24. The HF gas will react with and etch back the top surface of insulating layer 44, which is a silicon oxide in this embodiment. Other insulators, e.g., SiN, SION, and the like are also contemplated and may require other etch chemistries. Process by-products are formed by the reaction of the etchant gas with insulating layer 44 and, in order to reduce or eliminate adhesion of these by-products ($NH_4F$, $(NH_4)_2SiF_6$, and the like) to door 8, door 8 is heated (e.g., using heater 12). Heat shield 28 insulates door 8 and reduces or prevents transmission of heat from door 8 to wafer 22. In this way, the temperature across wafer 22 will be more uniform relative to a device that does not employ a heat shield 28.

FIG. 7 illustrates the results of the etch process, where insulating layer 44 has been etched back so that fins 40 and fins 42 extend a greater distance above the top surface of insulating layer 44 (relative to the pre-etch conditions illustrated in FIG. 6). As schematically illustrated, the fin height (distance above top of insulating layer 44) is substantially uniform across respective fins of first plurality of fins 40 and respective fins of second plurality of fins 42 and also uniform between first plurality of fins 40 relative to second plurality of fins 42. By providing for a uniform temperature across the wafer, variations in etch processes between the wafer edge and the wafer center are reduced or eliminated. One skilled in the art will recognize that the advantageous benefit of promoting temperature uniform across a workpiece can apply equally to numerous other processes and processing chambers, in addition to those illustrated herein.

One general aspect of embodiments disclosed herein includes a device including: a chamber defined by a chamber wall; a wafer holding stage within the chamber; a door in the chamber wall, the door configured to allow access to the chamber; a heater thermally coupled to the door and configured to heat the door to a predetermined temperatures; and a heat shield adjacent the door, the heat shield being configured to reduce transmission of heat from the door to the wafer holding stage.

Another general aspect of embodiments disclosed herein includes a device including: an etch chamber, a heat treatment chamber, and a vacuum/atmosphere switch chamber; a first stage in the vacuum/atmosphere switch chamber, a second stage in the etch chamber, and a third stage in the heat treatment chamber; a first gate door in a first common chamber wall between the vacuum/atmosphere switch chamber and the heat treatment chamber, the first gate door having a first face facing into the vacuum/atmosphere switch chamber and a second face facing into the load lock module; a second gate door in a second common chamber wall between the heat treatment chamber and the vacuum/atmosphere switch chamber, the second gate door having a third face facing into the heat treatment chamber and a fourth face facing into the etch chamber; and a gate door heat insulator formed on at least one face selected from the group including of the first face, the second face, the third face, and the fourth face.

Yet another general aspect of embodiments disclosed herein includes a method including: forming on a substrate a first plurality of fins having a first spatial density and being respectively insulated from one another by an insulating layer; forming on the substrate a second plurality of fins having a second spatial density, the second spatial density being less than the first spatial density, the second plurality of fins being respectively insulated from one another by the insulating layer; placing the substrate containing the first plurality of fins and second plurality of fins into a chamber by passing the substrate through a chamber door; closing the chamber door; heating the chamber door, while simultaneously thermally insulating the substrate from the heating; introducing an etchant gas into the chamber; and etching the insulating layer using the etchant gas.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
    a chamber defined by a chamber wall;
    a wafer holding stage within the chamber;
    a door in the chamber wall, the door configured to allow access to the chamber, the door comprising:
        an attachment structure connected to the chamber wall;
        a main structure having a first center portion and having a first outer periphery portion, the first outer periphery portion of the main structure surrounding the first center portion of the main structure; and
        hinges connecting the main structure to the attachment structure, the hinges allowing the main structure to rotate about the attachment structure;
    a heater configured to heat the door to a predetermined temperature; and
    a heat shield covering the door, the heat shield comprising:
        a metal plate exposed to the chamber; and
        a teflon membrane between the metal plate and the door, the teflon membrane having a second center portion and having a second outer periphery portion, the second outer periphery portion of the teflon membrane surrounding the second center portion of the teflon membrane, the second center portion of the teflon membrane covered by the metal plate, the second outer periphery portion of the teflon membrane uncovered by the metal plate, the first center portion of the main structure covered by the teflon membrane, the first outer periphery portion of the main structure uncovered by the teflon membrane.

2. The device of claim 1, wherein the heater is disposed in the attachment structure of the door, and the heater is configured to provide heat to the main structure of the door by thermal conduction of heat through the hinges of the door.

3. The device of claim 1, wherein the door and the metal plate comprise aluminum.

4. The device of claim 1, wherein the teflon membrane is flexible.

5. The device of claim 1, wherein the chamber is an etch chamber comprising a process gas inlet configured to introduce an etchant gas into the etch chamber, and the teflon membrane does not react with the etchant gas.

6. The device of claim 1, wherein the teflon membrane has a thickness of from 10 mm to 30 mm, and the metal plate has a thickness of from 0.2 mm to 10 mm.

7. The device of claim 1, wherein the predetermined temperature is from about 80° C. to about 120° C.

8. The device of claim 1, wherein the chamber wall is uncovered by the metal plate and the teflon membrane.

9. A device comprising:
    a deposition chamber comprising a first wafer holding stage;
    an etch chamber comprising a second wafer holding stage;
    a gate door in a common chamber wall between the etch chamber and the deposition chamber, the gate door comprising a main structure having a first face facing into the deposition chamber and having a second face facing into the etch chamber, the second face having a first center portion and having a first periphery portion, the first periphery portion surrounding the first center portion;
    a first heat shield between the gate door and the first wafer holding stage; and
    a second heat shield between the gate door and the second wafer holding stage, the second heat shield comprising a flexible membrane and a rigid plate, the rigid plate comprising aluminum, the flexible membrane comprising polytetrafluoroethylene, the flexible membrane disposed between the gate door and the rigid plate, the flexible membrane having a second center portion and having a second periphery portion, the second periphery portion surrounding the second center portion, the rigid plate having a first surface and a second surface, the first surface of the rigid plate contacting the second center portion of the flexible membrane, the second surface of the rigid plate exposed to the etch chamber and being free of the flexible membrane, the second periphery portion of the flexible membrane exposed to the etch chamber and being free of the rigid plate, the flexible membrane contacting the first center portion of the second face, the first periphery portion of the second face being free of the flexible membrane.

10. The device of claim 9 further comprising:
    a heater configured to heat the gate door to a predetermined temperature, the first heat shield configured to reduce transmission of heat from the gate door to the first wafer holding stage, the second heat shield configured to reduce transmission of heat from the gate door to the second wafer holding stage.

11. The device of claim 10, wherein the gate door further comprises:
    an attachment structure connected to a wall of the etch chamber, the main structure being connected to the attachment structure, the heater disposed in the attachment structure, the heater configured to provide heat to the main structure by thermal conduction of heat from the attachment structure.

12. The device of claim 9, wherein the second periphery portion of the second face contacts the common chamber wall.

13. The device of claim 9, wherein the flexible membrane is thicker than the rigid plate.

14. The device of claim 9, wherein the flexible membrane has a thickness of from 10 mm to 30 mm, and the rigid plate has a thickness of from 0.2 mm to 10 mm.

15. A device comprising:
    a chamber defined by a chamber wall;
    a wafer holding stage within the chamber, the wafer holding stage configured to support a wafer, the chamber comprising a process gas inlet configured to introduce an etchant gas to the wafer;
    a door in the chamber wall, the door configured to allow access to the chamber, wherein the door has a first center portion and has a first periphery portion, the first periphery portion surrounding the first center portion; and a heat shield between the door and the wafer holding stage, the heat shield comprising:
- a plate exposed to the chamber, wherein the plate, the door, and the chamber wall comprise a first material; and
- a flexible membrane between the plate and the door, wherein the flexible membrane comprises a second material, the second material different from the first material, wherein the second material does not react with the etchant gas, the flexible membrane contacting the first center portion of the door, the first periphery portion of the door being free of the flexible membrane, wherein the first material is aluminum and the second material is polytetrafluoroethylene, wherein the flexible membrane has a second center portion and has a second periphery portion, the second periphery portion surrounding the second center portion, the plate contacting the second center portion of the flexible membrane, the second periphery portion of the flexible membrane being free of the plate.

16. The device of claim 15, wherein the etchant gas is HF.

17. The device of claim 15, further comprising:
a heater configured to heat the door to a predetermined temperature.

18. The device of claim 17, wherein the predetermined temperature is from about 80° C. to about 120° C.

19. The device of claim 17, wherein the heater is disposed in the door.

20. The device of claim 15, wherein the flexible membrane has a thickness of from 10 mm to 30 mm, and the plate has a thickness of from 0.2 mm to 10 mm.

\* \* \* \* \*